United States Patent
Hemmett

(10) Patent No.: US 7,403,884 B2
(45) Date of Patent: Jul. 22, 2008

(54) TRANSIENT SIMULATION USING ADAPTIVE PIECEWISE CONSTANT MODEL

(75) Inventor: Jeffrey E. Hemmett, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 576 days.

(21) Appl. No.: 10/709,949

(22) Filed: Jun. 8, 2004

(65) Prior Publication Data

US 2005/0273307 A1 Dec. 8, 2005

(51) Int. Cl.
*G06F 17/50* (2006.01)

(52) U.S. Cl. .................. 703/14; 703/2; 703/19; 716/6

(58) Field of Classification Search .......... 703/2, 703/14, 13, 19; 716/5, 6
See application file for complete search history.

(56) References Cited

U.S. PATENT DOCUMENTS

| | | | |
|---|---|---|---|
| 4,918,643 A | 4/1990 | Wong | |
| 5,047,971 A | 9/1991 | Horwitz | |
| 5,588,142 A | 12/1996 | Sharrit | |
| 5,787,008 A | 7/1998 | Pullela et al. | |
| 5,852,445 A | 12/1998 | Yoshikawa et al. | |
| 6,052,523 A | 4/2000 | Shimazaki | |
| 6,195,623 B1 | 2/2001 | Brachtendorf | |
| 6,230,294 B1 | 5/2001 | Saito | |
| 6,374,390 B1 | 4/2002 | Quarles et al. | |
| 6,490,546 B1 | 12/2002 | Kimmel et al. | |
| 6,499,129 B1 | 12/2002 | Srinivasan et al. | |
| 6,553,340 B1 | 4/2003 | Kumashiro | |
| 7,096,174 B2 * | 8/2006 | Beattie et al. | 703/14 |

OTHER PUBLICATIONS

Yuan et al., F. Efficient Transient Analysis of Nonlinear Circuits Using Volterra Series and Piecewise Constant Interpolation, 2001 IEEE International Symposium on Circuits and Systems, vol. 3, May 2001, pp. 819-822.*

Rovnyak et al., S. Predicting Future Behavior of Transient Events Rapidly Enough to Evaluate Remedial Control Options in Real-Time, IEEE Transactions on Power Systems, vol. 10, No. 3, Aug. 1995, pp. 1195-1203.*

Liu et al., C.-W. New Methods for Computing Power System Dynamic Response for Real-Time Transient Stability Prediction, IEEE Transactions on Circuits and Systems-1:Fundamental Theory and Applications, vol. 47, No. 3, Mar. 2000, pp. 324-337.*

Tiwari et al., A.P. Spatial Control of a Large PHWR by Piecewise Constant Periodic Output Feedback, IEEE Transactions on Nuclear Science, vol. 47, No. 2, Apr. 2000, pp. 389-402.*

(Continued)

*Primary Examiner*—Russell Frejd
(74) *Attorney, Agent, or Firm*—Richard Kotulak; Hoffman Warnick LLC

(57) ABSTRACT

A transient simulation system, methods and program product that implement an adaptive piecewise constant (PWC) model are disclosed. The invention evaluates an error criteria to determine a maximum allowable change in one of a current and a voltage; and simulates the transient conditions by implementing an adaptive step in the PWC model according to the maximum allowable change. The invention allows dynamic or static adaptation of a PWC model according to an error criteria.

12 Claims, 5 Drawing Sheets

OTHER PUBLICATIONS

Chen et al., H.-J., Analytical Transient Solution for Short-Channel CMOS Devices Using a Pseudo Piecewise Constant Approach, IEEE, 42nd Midwest Symposium on Circuits and Systems, vol. 1, Aug. 1999, pp. 317-320.*

Grivet-Talocia, S. Adaptive Transient Solution of Nonuniform Multiconductor Transmission Lines Using Wavelets, IEEE Transaction on Antennas and Propagation, vol. 48, No. 10, Oct. 2000, pp. 1563-1573.*

Shedler, G. S., "Simulation Method for Register Insertion Rings," IBM Technical Disclosure Bulletin, vol. 35, No. 2, Jul. 1992, pp. 414-417.

* cited by examiner

TRANSIENT SIMULATION USING ADAPTIVE PIECEWISE CONSTANT MODEL

BACKGROUND OF INVENTION

1. Technical Field

The present invention relates generally to transient simulators, and more particularly, to a transient simulation system, methods and program product that implement an adaptive piecewise constant model.

2. Related Art

With the continuing miniaturization of very large scale integrated (VLSI) circuitry, interest in conducting formal circuit tuning using circuit transient simulation for gradient calculation is increasing. "Transient simulation" is the analysis of a circuit during time-varying conditions. "Tuning" includes optimization of a number of circuit parameters, e.g., device widths, to maximize circuit performance relative to circuit parameters. A challenge for circuit transient simulation is improving simulator performance, i.e., run time. Tuning also requires conducting another simulation to determine "gradients" for the circuit, which are circuit measurement sensitivities to other circuit parameters, e.g., a transistor's width effect on circuit delay, resistor size effect on circuit speed, etc. This technique further increases the importance of performance. Performance of a simulator is based on how many operations are required to determine circuit performance and gradients. Unfortunately, it is common for a particular simulation operation to be called millions of times during a tuning run.

One common simulation approach tests a circuit design by conducting simulations based on directly solving for voltages and currents via a simultaneous solve technique. Many of these type transient simulators provide for optimization of simulation by allowing an adaptive timing step, with the allowable timing step being chosen to ensure that some user-defined error criteria is satisfied. For example, a local truncation error (LTE) may be implemented that describes a single-step voltage error as a function of the time step. This adaptive timing step is advantageous for two reasons. First, it allows the simulator to adapt its rate of progress as needed to maintain accuracy, while maximizing performance. Second, it allows the user to have some level of control over a performance/accuracy tradeoff. There are some types of event-based fast simulators, however, for which this adaptive timing step capability is not possible.

One type of simulator in which an adaptive timing step is not possible are those that rely on piecewise constant (PWC) table models to represent the simulation parameters. FIG. 1 illustrates a graphical representation of a PWC table model in which a change in current ($\Delta I_R$) is constant within the model and a change in voltage ($\Delta V$) is constant for each step within the PWC model. In some cases, a change in current ($\Delta I_R$) may vary. PWC table models know current and voltage changes occurring at a particular circuit element at issue, but do not know the timing of the changes. PWC simulators solve for the time to the next step (h), or "segment boundary," in the PWC model. Once the time solving step is complete, the relevant values are then obtained directly from a PWC table model, i.e., these parameters remain constant between steps by definition. This model is in contrast to the above-described simulators in which a timing change is known and the current and voltage parameter values are simultaneously determined.

Although PWC approximation aids in rapid circuit simulation by limiting all circuit changes to predefined values at discrete points in time, this approach also makes it difficult to balance performance and accuracy available in other simulators because the integration scheme and simulation accuracy are essentially predefined in the PWC table models. That is, the simulation steps are determined solely by the table step size. To ensure accurate simulation with these simulators, the step sizes of the PWC model must be made fine enough to maintain accuracy over the worst case predicted simulation conditions. Unfortunately, this situation typically results in a very conservative level of accuracy for at least a portion of the simulation so as not to lose performance.

While it is possible to affect performance versus accuracy at a crude level in a PWC simulator, for example, through definition of a single optimized table step size during PWC model generation, it is not possible to implement, for example, an LTE relation to provide a controlled performance/accuracy balance. This inefficiency is particularly troublesome given the typical application for a PWC simulation approach—circuit tuning. Despite PWC simulators not providing the most efficient approach for transient simulation, their use remains advantageous because they provide the most efficient means of evaluating sensitivities for non-stiff systems. Unfortunately, as gradients are typically calculated many times inside a particular tuning loop, the effect on performance of a PWC simulation is significant.

In view of the foregoing, there is a need in the art for way of improving simulation performance for a PWC-based transient simulator.

SUMMARY OF INVENTION

The invention includes a transient simulation system, methods and program product that implement an adaptive piecewise constant (PWC) model. The invention evaluates an error criteria to determine a maximum allowable change in one of a current and a voltage; and simulates the transient conditions by implementing an adaptive step in the PWC model according to the maximum allowable change. The invention allows dynamic or static adaptation of a PWC model according to an error criteria.

A first aspect of the invention is directed to a method for simulating transient conditions in a circuit using a piecewise constant model, the method comprising the steps of: evaluating an error criteria to determine a maximum allowable change in a current-voltage pair; and simulating the transient conditions by implementing an adaptive step in the piecewise constant model according to the maximum allowable change.

A second aspect of the invention is directed to a method for simulating transient conditions in a circuit using a piecewise constant model including a plurality of steps, the method comprising the steps of: replacing a plurality of first steps in the piecewise constant model with a lesser number of second steps to address an error criteria; and simulating the transient conditions using the piecewise constant model including the lesser number of second steps.

A third aspect of the invention is directed to a computer program product comprising a computer useable medium having computer readable program code embodied therein for simulating transients conditions in a circuit using a piecewise constant model, the program product comprising: program code configured to evaluate an error criteria to determine a maximum allowable change in a current-voltage pair; and program code configured to simulate the transient conditions by implementing an adaptive step in the piecewise constant model according to the maximum allowable change.

A fourth aspect of the invention is directed to a system for simulating transient conditions in a circuit using a piecewise constant model, the system comprising: means for evaluating an error criteria to determine a maximum allowable change in a current-voltage pair; and means for simulating the transient conditions by implementing an adaptive step in the piecewise constant model according to the maximum allowable change.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

For purposes of clarity only, the detailed description includes the following outline: I. PWC-based Simulation System Overview; II. Operational Methodology; and III. Conclusion.

The present invention includes a system, methods and program product to achieve a performance/accuracy tradeoff while using a piecewise constant (PWC) simulation approach. As the integration scheme of PWC-based simulators is essentially locked into the corresponding PWC models (as described above), the invention provides a way to define adaptive PWC models, with the step size adapting as needed to satisfy error criteria. The invention allows the simulation software to make small steps in critical regions to maintain accuracy, while allowing larger steps where possible for performance. The invention also allows a single model to be used to represent all linear elements (such as resistors in the case of electrical simulation), as the optimal step size automatically adapts with element value. These benefits both improve the computational efficiency of the code and simplify the definition of element models.

I. PWC-based Simulation System Overview

Figure 2:
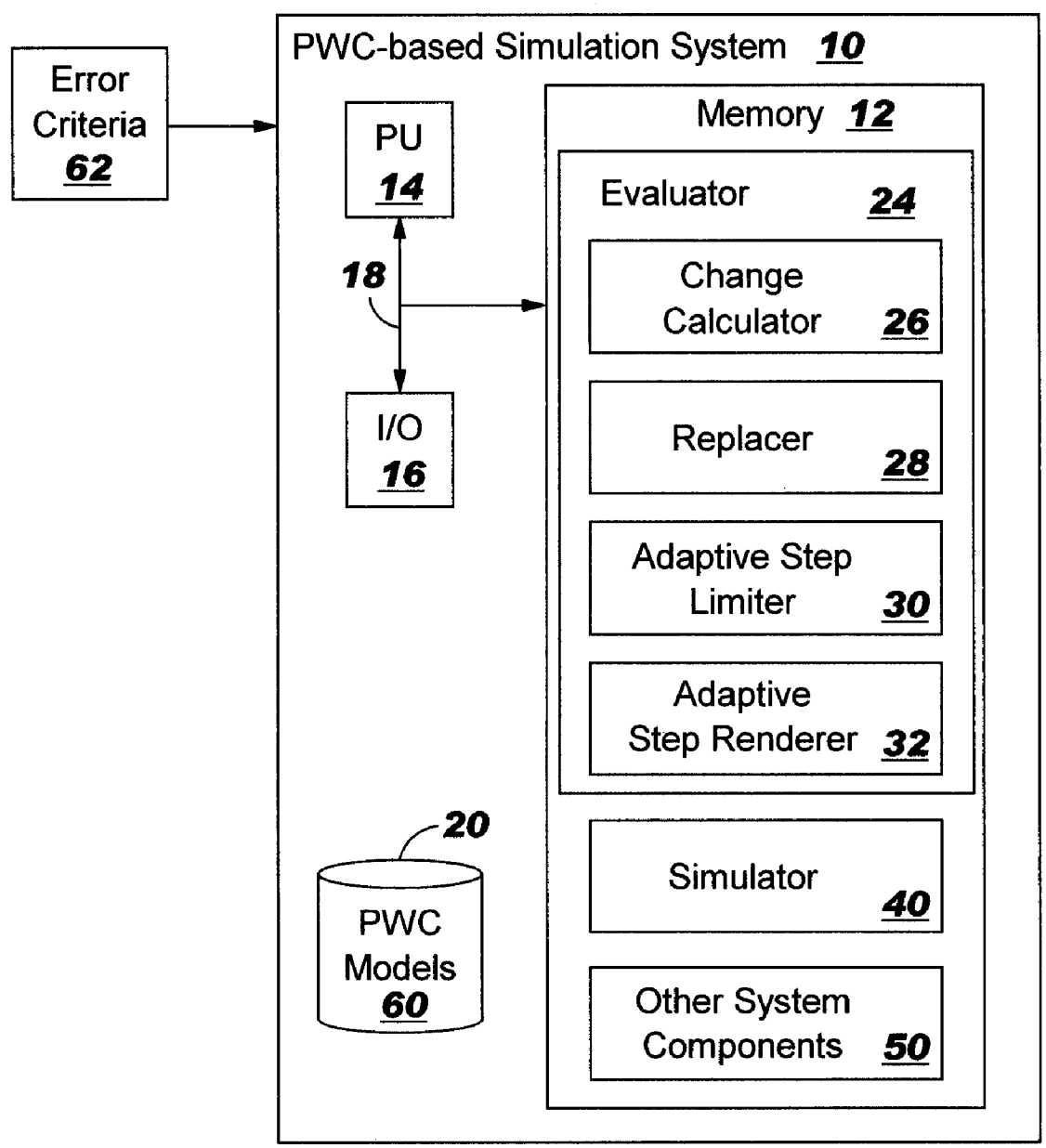
FIG. 2 shows a block diagram of a simulation system according to the invention.

With reference to the accompanying drawings, FIG. 2 is a block diagram of a piecewise constant (PWC) based simulation system 10 in accordance with the invention. Simulation system 10 includes a memory 12, a processing unit (PU) 14, input/output devices (I/O) 16 and a bus 18. A database 20 may also be provided for storage of data relative to processing tasks. Memory 12 includes a program product 22 that, when executed by PU 14, comprises various functional capabilities described in further detail below. Memory 12 (and database 20) may comprise magnetic media, optical media, random access memory (RAM), read only memory (ROM), a data object, etc. Moreover, memory 12 (and database 20) may reside at a single physical location comprising one or more types of data storage, or be distributed across a plurality of physical systems. PU 14 may likewise comprise a single processing unit, or a plurality of processing units distributed across one or more locations. I/0 16 may comprise any known type of input/output device including a network system, modem, keyboard, mouse, scanner, voice recognition system, CRT, printer, disc drives, etc. Additional components, such as cache memory, communication systems, system software, etc., may also be incorporated into simulation system 10.

As shown in FIG. 2, program product 22 may include an evaluator 24 including a change calculator 26, a replacer 28, an adaptive step limiter 30, and an adaptive step renderer 32; a simulator 40 and other system components 50. Simulator 40 includes any now known or later developed PWC-based simulator. Other system components 50 include any other function necessary or desired for simulation system 10 not otherwise explicitly described herein.

As also shown in FIG. 2, an error criteria 62 may be input to simulation system 10, as will be described in more detail below. Database 20 includes a number of PWC models 60 that may be recalled and then modified as described herein below.

II. Operational Methodology

Figure 3:
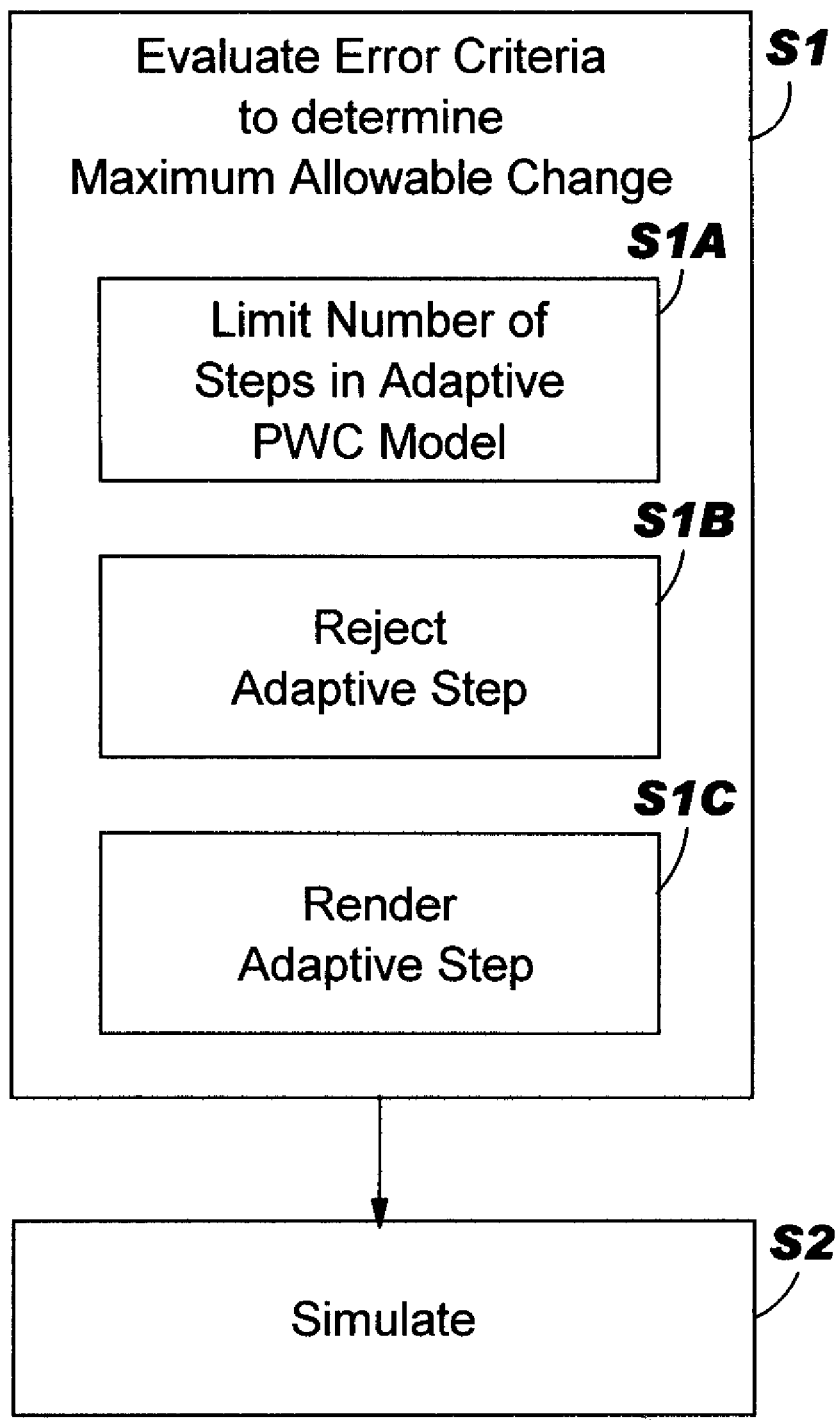
FIG. 3 shows a flow diagram of operation methodology according to a first embodiment of the invention.

Turning to FIG. 3, a method for simulating transient conditions in a circuit using an adaptive PWC model is illustrated according to a first embodiment of the invention.

Figure 1:
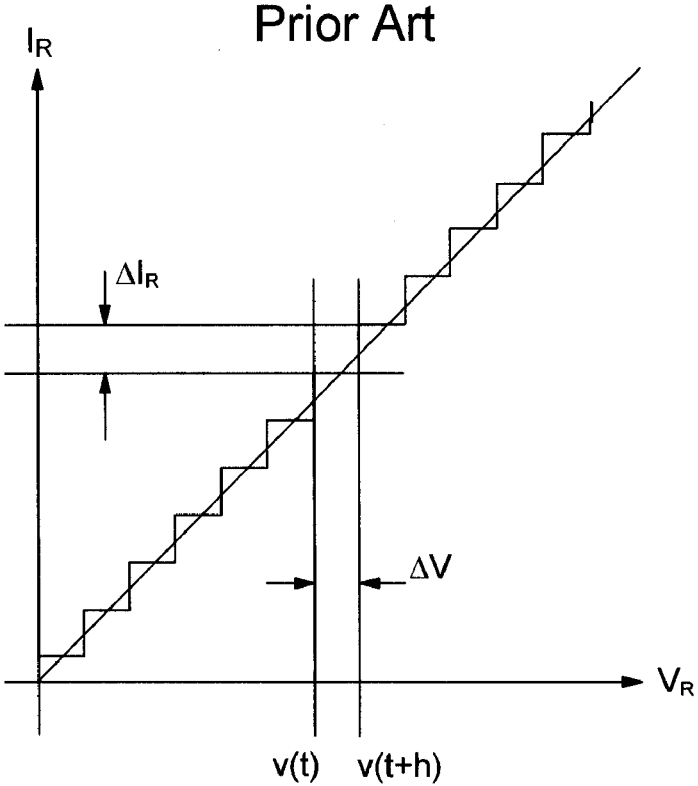
FIG. 1 shows a graphical representation of a conventional piecewise constant (PWC) model for use by a simulation system.
Figure 4:
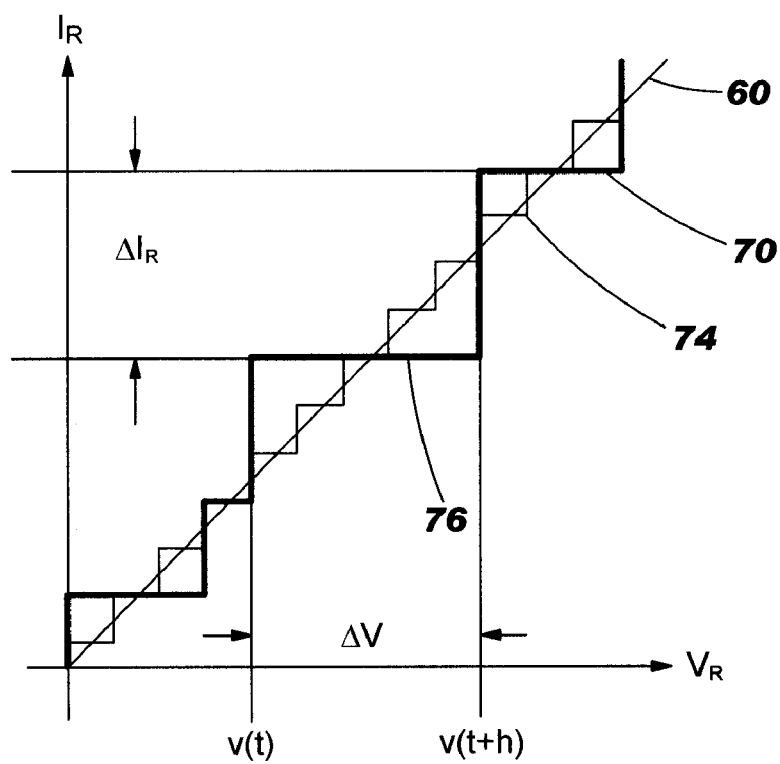
FIG. 4 shows a graphical representation of an adaptive PWC model.

In a first step S1, an error criteria 62 (FIG. 2) is evaluated to determine a maximum allowable change in a current-voltage pair in a PWC model 60 by evaluator 24 (FIG. 2). As used herein, "current-voltage pair" signifies a current-voltage relationship. A "change in a current-voltage pair" may be initiated in terms of a change in current or a change in voltage, but inherently results in a change in both. FIG. 4 illustrates a graphical representation of a PWC model 60 (FIG. 2) recalled from database 20. As shown, PWC model 60 includes equally proportioned steps 74 in which a current change ($\Delta I_R$) is constant and a voltage change ($\Delta V$) is constant for each step. PWC model 60 implements a plurality of steps representing integration step sizes. For a given voltage range, a current is maintained constant such that a graph of PWC model 60 appears in a stair form for models with liner current-voltage relations. For non-linear models, a voltage change remains constant while a current change adjusts as needed to track the function. Performance of PWC model 60, i.e., run time, is based on the number of steps that must be performed. Accordingly, fewer steps results in greater performance, but less accuracy.

Overlayed over PWC model 60 is an adaptive PWC model 70, according to the invention, in which an adaptation in a current-voltage pair is made (i.e, an adaptation of a current change ($\Delta I_R$) or a voltage change ($\Delta V$)) within the model to address error criteria 62. As illustrated, a plurality of predefined (first) steps 74 of PWC model 60 have been replaced by replacer 28 (FIG. 2) by a lesser number of (second) steps 76 of adaptive PWC model 70. Accordingly, adaptive PWC model 70 increases the size of steps, which reduces event count and reduces simulation time. An adaptive PWC model 70 may be implemented for each element of a circuit to be simulated. Adaptive PWC model 70 can be implemented during runtime as needed in a dynamic approach, or as a static approach, as will be described further below.

Returning to FIG. 3 in conjunction with FIG. 2, error criteria 62 may be set to address a number of error-based situations. In one preferred embodiment, error criteria 62 is based on a variety of an approximate relative timing error ($\Delta t/t$). An error criteria 62 can be input in a variety of forms. In one embodiment, an error criteria 62 may be input as a percentage, e.g., 5%. In this case, if an input to a node is expected to take 100 picoseconds (ps), and takes 94 ps, then an error criteria of 5% would be violated, which would allow implementation of an adaptive step 76 (FIG. 4), e.g., lengthening of a step by changing $\Delta V$. An approximate relative timing error ($\Delta t/t$) can be defined as:

$$\Delta t/t = (\Delta I/V'C_{eq})^2$$

where $\Delta t$ is time change between an initiating event (e.g., v(t) in FIG. 4 and a subsequent event v(t+h), i.e., $\Delta t=(t+h)-t$), t is time of the initiating event v(t), V' is the derivative voltage for the present element, e.g., how fast voltage rising/falling across resistor (v/s)), $\Delta I$ is the current change, and $C_{eq}$ is an equivalent series capacitance across an element, which is most likely caused by device parasitics.

A maximum allowable change in terms of current $\Delta I_{max}$ is determined by change calculator 26 (FIG. 2) according to the rearrangement of the above equation to:

$$\Delta I_{max} = (\Delta t/t)^{1/2} V'C_{eq}$$

Figure 5:
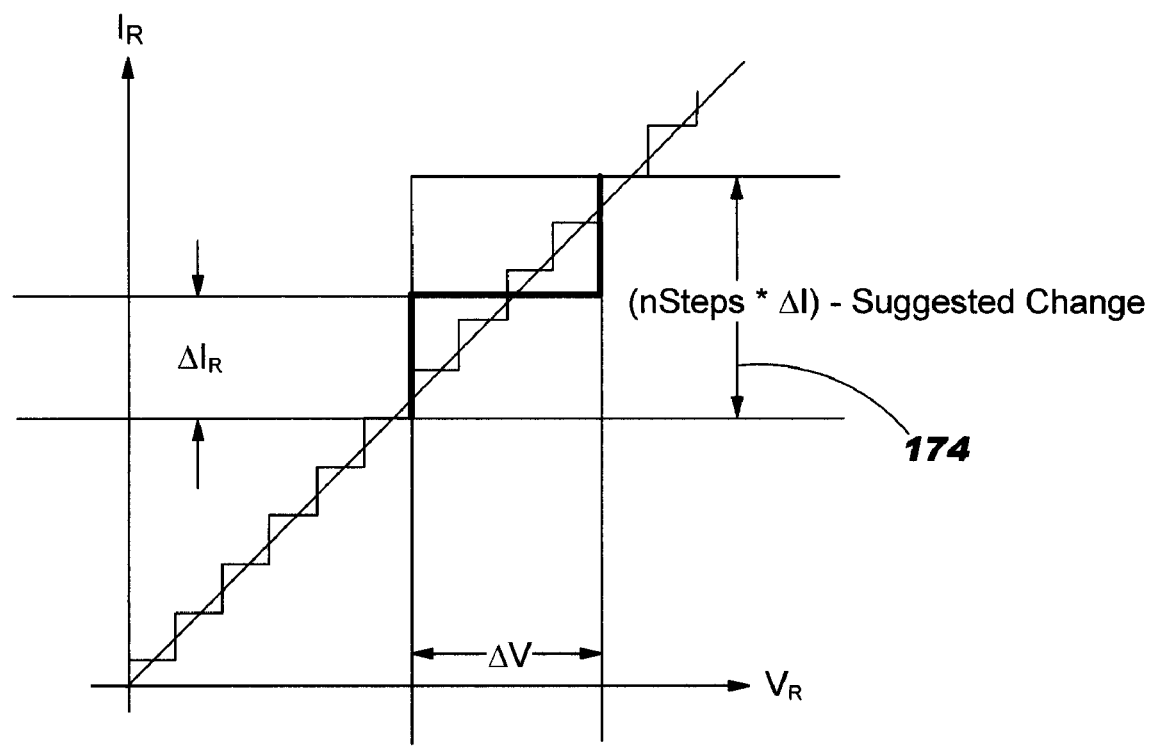
FIG. 5 shows a graphical representation of rendering of an adaptive step of an adaptive PWC model according to an optional embodiment of the invention.

While, in this case, the maximum allowable change is determined in terms of a current, it should be recognized that a maximum allowable change in terms of voltage ($\Delta V$) can be derived from the current change ($\Delta I$) using the known current-voltage pair relationship in a trapezoidal integration scheme (FIG. 5). This is represented as a "finegrained" PWC nominal step-size model at the minimum allowable $\Delta V$ step, multiples of which may actually be taken based on $\Delta I_{max}$ (multiple=$N_{step}$, as described below).

As shown in FIG. 3, a second step S2 includes simulating transient conditions by simulator 40 (FIG. 2) by implementing an adaptive step in the piecewise constant model according to the maximum allowable change. As noted above, simulator 40 (FIG. 2) may include any now known or later developed PWC-based simulator.

With further regard to evaluation step S1, one challenge for the above evaluation steps is that simulation system 10 evaluates each element separately. In this case, it is possible for an element to cause a large enough time change $\Delta t$ in an adaptive step such that evaluation of other effects from neighboring elements would be overlooked. That is, a time of evaluation would skip necessary evaluations. In order to address this situation, as an optional sub-step S1A of evaluation step S1, the number of adaptive steps that adaptive PWC model 70 (FIG. 3) can include may be limited by adaptive step limiter 30 (FIG. 2). Sub-step S1A may be initiated by determining a number of steps $N_{step}$ by dividing the maximum allowable change by a corresponding predefined minimum allowable change. That is, according to:

$$N_{step} = \Delta I_{max}/\Delta I_{normal}$$

where $\Delta I_{max}$ is the maximum allowable change in current and $\Delta I_{nominal}$ is a nominal resolution, i.e, minimum allowable change. The number of steps $N_{step}$ may also be calculated in terms of voltage. Calculation of $N_{step}$ could result in a number ranging from 0 to $1e^{12}$. Where $N_{step}$ is a very large number (e.g., >3000), implementation may not be advisable. To prevent overburdening simulation system 10, the number of steps $N_{step}$ may be limited to some "reasonable" value by adaptive step limiter 30 (FIG. 2). For example, the following logic may be implemented to limit the number of steps: if $N_{step}<1$, then $N_{step}=1$; else, if $N_{step}<100$, then $N_{step}=100$; else, if $N_{step}<3000$, then $N_{step}=500$; else, $N_{step}=750$. It should be recognized that different situations may require different ranges of the number of steps, and that the above description is only illustrative.

In another optional sub-step S1B, the adaptive step may be rejected by replacer 28 (FIG. 2) when the sign of the derivative voltage across a circuit element of interest reverses. Conventional PWC simulators never allow an instantaneous change in sign on a derivative voltage as it can result in numerical instability. Simulation system 10 provides the same safety feature by rejecting the value of $N_{step}$ calculated by the adaptive feature and forcing $N_{step}$ to equal 1 if the derivative voltage reverses sign, e.g., positive to negative.

In another optional sub-step S1C, an adaptive step is rendered, i.e., inserted into PWC model 70, by adaptive step renderer 32 (FIG. 2) at an average value of the maximum allowable change. In particular, as shown in FIG. 5, if a maximum allowable change $\Delta I_{max}$ provides any value other than a nominal $\Delta I$ (minimum), the adaptive step 174 must not be exhausted on the current step. In particular, it is most advantageous if the adaptive step crosses a middle of an original step to maintain a trapezoidal integration scheme. As shown in FIG. 5, adaptive step 174 is implemented over two subsequent steps to maintain a trapezoidal scheme.

Dynamic and Static Models

Figure 6:
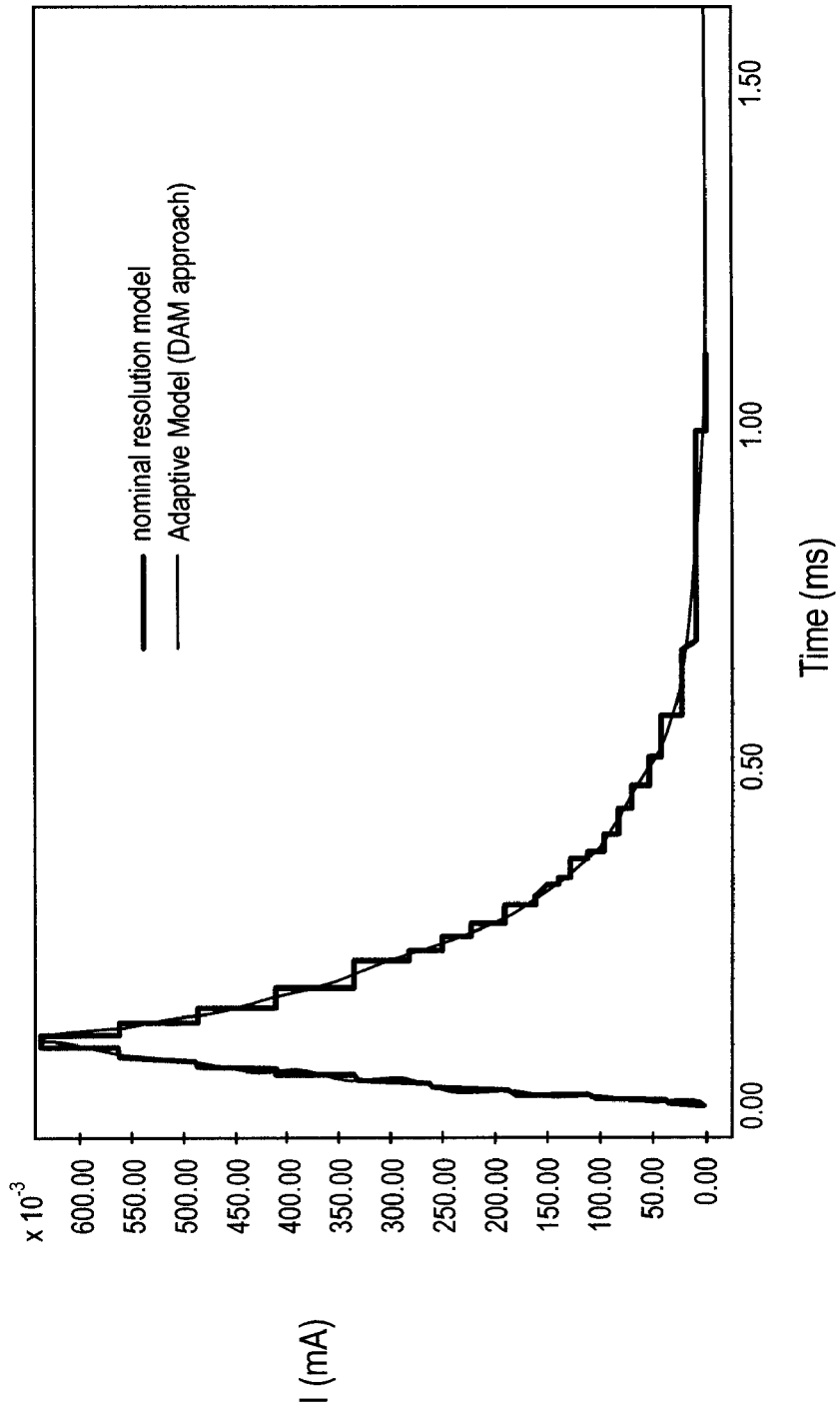
FIG. 6 shows a graphical representation comparing a conventional PWC model to an adaptive PWC model.

In one embodiment, the above-described evaluating step S1 executes dynamically during the simulating step S2 such that for each element at least one adaptive step can be implemented, i.e, adaptive PWC model 70 (FIG. 3) is continually changing. FIG. 6 illustrates a graphical representation comparing a conventional PWC model to an adaptive PWC model according to the dynamic approach. This dynamic approach allows for the most adaptability in the PWC model definition, as each step is defined to satisfy a current simulation condition. However, to leverage this adaptability, a very fine nominal step size is required. Also, as the adaptive algorithm must be executed at every simulation step, it also can carry a moderately high computational overhead. This is particularly true for nonlinear element models, where it is not possible to interpolate the element parameters over multiple steps. Therefore, this approach is generally better suited for linear elements. This linearity allows the element "model" to consist of a single segment definition, and as the model consists of single real-valued piece of data, there is no overhead to making this segment relatively small (as opposed to models in which the memory requirements go up with the dimensionality of the element parameters). The actual step size required during any simulation step is then calculated to satisfy the error requirement, and the independent variable is linearly interpolated from this step size.

However, in an alternative embodiment, the evaluating step S1 executes prior to the simulating step S2 such that adaptive PWC model 70 (FIG. 3) is static. In the static approach, the adaptive PWC model is predefined, and remains constant during simulation. While this approach has the drawback of not being able to react to the changing conditions that exist during simulation, it also incurs no computational overhead during simulation. The static approach is also less dependent on the nominal segment size used in the original PWC model. Therefore, the static approach can be slightly more conservative, but is generally applicable to all circuit elements.

III. Conclusion

In the previous discussion, it will be understood that the method steps discussed are performed by a processor, such as PU 14 of system 10, executing instructions of program product 22 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention, could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A computer-readable medium storing computer instructions, which when executed, enables a computer system to generate simulated transient conditions in a circuit using a piecewise constant model, the computer instructions comprising:
   evaluating an error criteria to determine a maximum allowable change in one of a current and a voltage, wherein the error criteria is based on an approximate relative timing error;
   simulating the transient conditions by implementing an adaptive step in the piecewise constant model according to the maximum allowable change; and
   analyzing the circuit based on a result of the simulation.

2. The computer-readable medium of claim 1, wherein the simulating instruction replaces a plurality of predefined steps of the piecewise constant model.

3. The computer-readable medium of claim 1, wherein the evaluating instruction executes dynamically during execution of the simulating instruction.

4. The computer-readable medium of claim 1, wherein the evaluating instruction executes prior to the simulating instruction.

5. The computer-readable medium of claim 1, further comprising instructions configured to reject the adaptive step in the case that a derivative voltage across a circuit element of interest reverses.

6. The computer-readable medium of claim 1, wherein a plurality of adaptive steps are implemented, and further comprising instructions configured to limit the number of adaptive steps.

7. The computer-readable medium of claim 1, wherein the evaluating instruction renders the adaptive step at an average value of the maximum allowable change.

8. A computer-implemented system for simulating transient conditions in a circuit using a piecewise constant model, the system comprising:
   at least one processing unit;
   a memory operably associated with the at least one processing unit; and
   a simulating system storable in memory and executable by the at least one processing unit, the simulating system comprising:
      means for evaluating an error criteria to determine a maximum allowable change in one of a current and a voltage;
      means for simulating the transient conditions by implementing an adaptive step in the piecewise constant model according to the maximum allowable change;
      means for analyzing the circuit based on a result of the simulating; and
      means for rejecting the adaptive step in the case that a derivative voltage across a circuit element of interest reverses.

9. The computer-implemented system of claim 8, wherein the evaluating means executes dynamically during execution of the simulating means.

10. The computer-implemented system of claim 8, wherein the evaluating means executes prior to execution of the simulating means.

11. The computer-implemented system of claim 8, wherein a plurality of adaptive steps are implemented, and further comprising means for limiting the number of adaptive steps.

12. The computer-implemented system of claim 8, wherein the evaluating means includes means for rendering the adaptive step at an average value of the maximum allowable change.

* * * * *

UNITED STATES PATENT AND TRADEMARK OFFICE
CERTIFICATE OF CORRECTION

PATENT NO. : 7,403,884 B2 Page 1 of 1
APPLICATION NO. : 10/709949
DATED : July 22, 2008
INVENTOR(S) : Hemmett It is certified that error appears in the above-identified patent and that said Letters Patent is hereby corrected as shown below:

PLEASE DELETE ITEM (75) AND INSERT JEFFREY E. HEMMETT, ST GEORGE, VT (US)

Signed and Sealed this

Fourteenth Day of October, 2008

JON W. DUDAS
*Director of the United States Patent and Trademark Office*

UNITED STATES PATENT AND TRADEMARK OFFICE
CERTIFICATE OF CORRECTION

PATENT NO. : 7,403,884 B2
APPLICATION NO. : 10/709949
DATED : July 22, 2008
INVENTOR(S) : Hemmett Page 1 of 1

It is certified that error appears in the above-identified patent and that said Letters Patent is hereby corrected as shown below:

PLEASE DELETE ITEM (75) AND INSERT JEFFREY G. HEMMETT, ST GEORGE, VT (US)

This certificate supersedes the Certificate of Correction issued October 14, 2008.

Signed and Sealed this

Eighteenth Day of November, 2008

JON W. DUDAS
*Director of the United States Patent and Trademark Office*